United States Patent
Weidinger et al.

(10) Patent No.: US 9,253,888 B2
(45) Date of Patent: Feb. 2, 2016

(54) METHOD FOR INTEGRATING AN ELECTRONIC COMPONENT INTO A PRINTED CIRCUIT BOARD OR A PRINTED CIRCUIT BOARD INTERMEDIATE PRODUCT, AND PRINTED CIRCUIT BOARD OR PRINTED CIRCUIT BOARD INTERMEDIATE PRODUCT

(75) Inventors: Gerald Weidinger, Leoben (AT); Andreas Zluc, Leoben (AT); Johannes Stahr, St. Lorenzen (AT)

(73) Assignee: AT & S Austria Technologie & Systemtechnik Aktiengesellschaft (AT)

(*) Notice: Subject to any disclaimer, the term of this patent is extended or adjusted under 35 U.S.C. 154(b) by 370 days.

(21) Appl. No.: 13/980,383

(22) PCT Filed: Jan. 24, 2012

(86) PCT No.: PCT/AT2012/000011
§ 371 (c)(1),
(2), (4) Date: Sep. 11, 2013

(87) PCT Pub. No.: WO2012/100274
PCT Pub. Date: Aug. 2, 2012

(65) Prior Publication Data
US 2014/0000941 A1    Jan. 2, 2014

(30) Foreign Application Priority Data
Jan. 26, 2011    (AU) .................. GM41/2011

(51) Int. Cl.
*H05K 1/18*    (2006.01)
*H05K 1/02*    (2006.01)
(Continued)

(52) U.S. Cl.
CPC ................ *H05K 1/188* (2013.01); *F16D 13/72* (2013.01); *F16D 69/026* (2013.01); *H01L 24/18* (2013.01); *H05K 1/0212* (2013.01);
(Continued)

(58) Field of Classification Search
CPC ....... H05K 1/181; H05K 1/182; H05K 1/185; H05K 1/186; H05K 1/187; H05K 1/188
See application file for complete search history.

(56) References Cited

U.S. PATENT DOCUMENTS

2006/0291173 A1    12/2006    Cho et al.
2008/0196930 A1    8/2008    Tuominen et al.
(Continued)

OTHER PUBLICATIONS

European Patent Office, International Search Report for Application No. PCT/AT2012/000011, mailed Aug. 6, 2012.

*Primary Examiner* — Jeremy C Norris
(74) *Attorney, Agent, or Firm* — Design IP

(57) ABSTRACT

In a method for integrating at least one electronic component into a printed circuit board or a printed circuit board intermediate product, the following steps are provided: providing a layer for at least temporarily supporting the electronic component, fixing the electronic component on the layer, arranging a conductive layer on the supporting layer with at least one cutout corresponding to the dimensions of the electronic component to be fixed, at least partly encapsulating or covering the component fixed on the supporting layer with an insulating material, exposing the electronic component, and at least partial regions of the conductive layer, which adjoins the component and is arranged on the supporting layer, and at least partly making contact between the electronic component and the conductive layer adjoining the component. Furthermore, a printed circuit board and a printed circuit board intermediate product having an integrated electronic component are provided.

18 Claims, 4 Drawing Sheets

(51) Int. Cl.
  *H05K 1/09* (2006.01)
  *H05K 3/30* (2006.01)
  *F16D 13/72* (2006.01)
  *F16D 69/02* (2006.01)
  *H01L 23/00* (2006.01)
  *F16D 69/00* (2006.01)

(52) U.S. Cl.
  CPC ............... *H05K 1/0271* (2013.01); *H05K 1/09* (2013.01); *H05K 1/182* (2013.01); *H05K 1/185* (2013.01); *H05K 1/186* (2013.01); *H05K 1/187* (2013.01); *H05K 3/30* (2013.01); *F16D 2069/004* (2013.01); *F16D 2200/0073* (2013.01); *F16D 2250/0046* (2013.01); *F16D 2300/10* (2013.01); *H01L 2924/351* (2013.01); *H05K 2203/0152* (2013.01); *H05K 2203/1469* (2013.01); *Y10T 29/49146* (2015.01)

(56) References Cited

U.S. PATENT DOCUMENTS

| | | |
|---|---|---|
| 2009/0230541 A1 | 9/2009 | Araki et al. |
| 2010/0044845 A1 | 2/2010 | Funaya et al. |
| 2010/0214750 A1 | 8/2010 | Tuominen et al. |

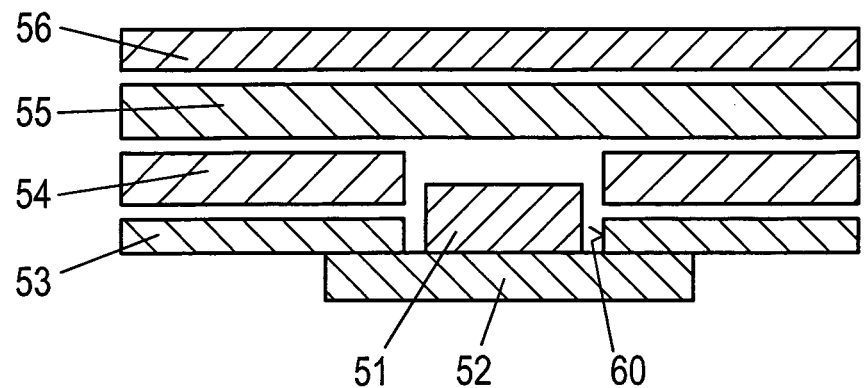
Fig. 5a
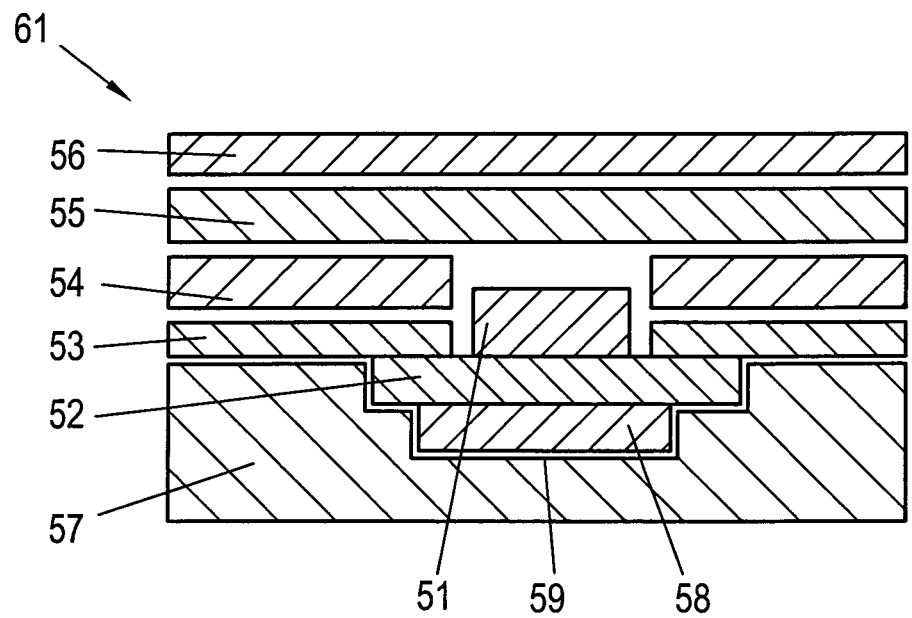
Fig. 5b
Fig. 5

METHOD FOR INTEGRATING AN ELECTRONIC COMPONENT INTO A PRINTED CIRCUIT BOARD OR A PRINTED CIRCUIT BOARD INTERMEDIATE PRODUCT, AND PRINTED CIRCUIT BOARD OR PRINTED CIRCUIT BOARD INTERMEDIATE PRODUCT

CROSS REFERENCE TO RELATED APPLICATIONS

The present application is a U.S. National Stage Application of PCT application Serial No. PCT/AT2012/000011, filed on 24 Jan. 2012, which claims priority from Austrian Patent Application Serial No. GM 41/2011, filed on 26 Jan. 2011, both of which are incorporated by reference in their entireties.

BACKGROUND OF THE INVENTION

The present invention relates to a method for integrating at least one electronic component into a printed circuit board or a printed circuit board intermediate product, and to a printed circuit board or a printed circuit board intermediate product.

In the context of growing product functionalities of devices equipped with electronic components and increasing miniaturization of such electronic components as well as a rising number of electronic components to be mounted on printed circuit boards, increasingly more powerful field- or array-like components or packages having several electronic components are being employed, which have a plurality of contacts or connections, with ever smaller spacing between these contacts. The fixation or connection of such components increasingly requires the use of highly routed printed circuit boards, wherein it is conceivable that simultaneous reduction of the product size and of the components and printed circuit boards to be used, both with regard to the thickness and the area of such elements, will entail that mounting or arranging such electronic components by way of the required plurality of contact points on the printed circuit boards will become problematic or reach the boundaries of the possible resolution of such contact points.

So as to solve such problems, it has been proposed to integrate at least some electronic components in a printed circuit board, with reference being made in this regard to WO 03/065778, WO 03/065779 or WO 2004/077902, for example. However, the drawback of these known methods or embodiments of electronic components or parts integrated into a printed circuit board is that respective recesses or holes must be provided in a base element of a printed circuit board to receive such electronic components or parts, wherein additionally conductor tracks are formed before a component is arranged in such a hole. Soldering processes and bonding techniques are employed for making contact with the components, wherein contact points usually result between materials of different types between elements of the conductor tracks and the contact or connection points of the electronic components. Especially when such systems are used in environments that are subject to large temperature differences or ranges of temperature change, the use of different materials in the region of the contact or connection points, on the basis of different thermal coefficients of expansion, results in mechanically and/or thermally induced stresses, which can result in at least one contact or connection point to crack, and consequently lead to failure of the component. Moreover, it is conceivable that boreholes, in particular laser boreholes, which are additionally required for producing contact surfaces, cause further strain to the components. It is also disadvantageous that it is more difficult for the components, which are embedded in the recesses or depressions to be produced, to make contact with conductor tracks and contact surfaces by way of soldering pastes or bonding wires, or that this cannot be reliably achieved, especially when used with fluctuating temperature loads. Moreover, it is a drawback that potentially necessary high pressures and temperatures during the printed circuit board production process cause strain to the embedded and connected components. In addition, heat dissipation of optionally higher loaded electronic components is problematic.

Methods for producing a printed circuit board and for embedding an electronic component in a printed circuit board are known from US 2008/0196930 A1 and US 2010/0214750 A1, respectively, wherein clearances are provided in a conducting layer in accordance with contacts of a component to be integrated or fixed, so that a high effort with regard to the configuration and positioning of such clearances in consideration of the small dimensions of such contacts is required.

Modified embodiments for embedding components in a printed circuit board are disclosed in US 2009/0230541 A1, US 2006/0291173 A1 or US 2010/0044845 A1, which are directed to a simplification of the electrical connection, for example.

Therefore, it is the object of the present invention to minimize or eliminate said problems during the integration of at least one electronic component into a printed circuit board, and in particular to provide a method of the type mentioned above and a printed circuit board or a printed circuit board intermediate product, in which, using simple method steps, simple and reliable mounting of such an electronic component in a printed circuit board, or in a printed circuit board intermediate product, can be achieved, while providing particularly simple registration and having a reduced thickness of the printed circuit board that is to be produced, or the printed circuit board intermediate product that is to be produced.

SUMMARY OF THE INVENTION

So as to achieve these objects, a method of the type mentioned above essentially comprises the following steps:
providing a layer to at least temporarily support the electronic component;
fixing the electronic component on the layer, wherein contacts of the electronic component, or a conducting layer disposed on a surface of the electronic component, is oriented toward the supporting layer;
disposing a conducting layer having at least one clearance in accordance with the dimensions of the electronic component to be fixed, on the supporting layer at the height of contacts of the electronic component or of a conducting layer of a surface of the electronic component, wherein the conducting layer adjoining the component is formed by a metallic foil, preferably a Cu foil;
at least partially encasing or covering the component fixed on the supporting layer and at least regions of the conducting layer, which adjoins the component and is disposed on the supporting layer, with an insulating material, for example a prepreg film and/or a resin;
exposing the contacts or the conducting layer of the electronic component and at least regions of the conducting layer, which adjoins the component and is disposed on the supporting layer, after or by removal of the supporting layer; and at least partially making contact between the contacts or the conducting layer of the electronic component and the conducting layer adjoining the component.

By disposing a conducting layer on the supporting layer, the conducting layer having at least one clearance in accordance with the dimensions of the electronic component to be fixed, the invention enables to dispose such a conducting layer at the same height as the contacts or the conducting layer of the electronic component to be embedded, further enabling simplified making contact between this conducting layer and the integrated electronic component. Disposing this conducting layer at the same height as a surface of the electronic component to be subsequently exposed allows a reduction of the overall height of the printed circuit board to be produced, or of the printed circuit board intermediate product to be produced. Moreover, disposing the conducting layer in this way essentially at the same height as a surface of the component to be exposed, simplifies making contact between the component and the adjoining regions of the conducting layer more easily; this offers a printed circuit board, or a printed circuit board intermediate layer, having an overall simplified or improved arrangement of the electronic component to be integrated as well as simplified electrical connection thereof. In addition, the registration or orientation of the electronic component can be simplified or facilitated during the mounting or fixing thereof as a result of the clearance or recess of the conducting layer. So as to simplify the provision or arrangement of the conducting layer in the regions adjoining the component to be received or supported, the invention additionally suggests that the conducting layer adjoining the component is formed by a metallic foil, preferably a Cu foil. Such a metallic foil, preferably Cu foil, can be provided having a thickness as suitable, and it can be disposed using simple method steps known for the production of a printed circuit board and can be connected to further layers or elements of such a printed circuit board, or a printed circuit board intermediate product.

So as to fix the electronic component to be integrated in a simple and reliable way, one preferred embodiment of the method according to the invention envisages that the electronic component is fixed to the supporting layer by way of an adhesive, an adhesive film, an adhesive coating of the component or the like, wherein the adhesive layer is removed together with the supporting layer. In particular in accordance with the further processing steps, it is thus possible to provide different means for fixing the electronic component to the supporting layer, wherein it is not only possible to make these means available in an appropriate smaller thickness, but also allow easy and reliable exposure of the conducting layer and of the contacts of the component to be integrated after having been encased.

Especially with regard to a reduction of the overall thickness of the printed circuit board, or of the printed circuit board intermediate product, to be produced, a further preferred embodiment suggests that the adhesive layer or film or coating has a thickness of no more than 15 µm, preferably approximately 0.1 to 10 µm. According to the invention, a comparatively smaller thickness of an adhesive layer or film may thus be sufficient, enabling reliable adhesion or fixation of the electronic component on the supporting layer, despite such a smaller thickness of the adhesive layer or film.

So as to add the adhesive layer in a particularly simple and reliable manner, it is additionally proposed to apply an adhesive layer by way of ink jet, flexographic, intaglio or offset printing, which corresponds to a further preferred embodiment of the method according to the invention.

In particular depending on the intended use of the electronic component to be integrated and/or the orientation of the contacts or of a conducting layer of the component in relation to the supporting layer, one further preferred embodiment suggests that the metallic foil, preferably Cu foil, is configured in particular for a conductive structure having a thickness of no more than 15 µm, preferably approximately 0.1 to 10 µm. At an appropriately smaller thickness for the metallic foil, preferably Cu foil, a simple and reliable electrical connection with the contacts of the electronic component to be integrated is provided using a thin, in particular structured, conductive layer.

If good heat dissipation in the lateral or edge regions of the electronic component to be integrated should be required, in particular in the case of components to be integrated that have high power, which during use or operation thereof develop comparatively large amounts of heat that would need to be dissipated, a modified and preferred embodiment of the method according to the invention envisages that the metallic foil, preferably Cu foil, is configured in particular for heat dissipation with a thickness of no more than 500 µm, and more preferable approximately 35 to 400 µm. Such a comparatively high thickness allows an electronic component to be integrated to be essentially surrounded over the entire circumference thereof by such a metallic foil having good thermal conductivity, so that the heat generated by the electronic component to be integrated can be distributed over larger areas or regions of the printed circuit board, or of the printed circuit board intermediate product.

As already mentioned above, contact can be made easily and reliably between the electronic component to be integrated and the additional conducting layer, which is disposed essentially at the height or the level of the contacts of the electronic component to be integrated, and in this connection a further preferred embodiment suggests that the conducting layer adjoining the component is formed by a structured layer, wherein the conducting layer is structured preferably after lamination.

For a particularly simple and reliable electrical connection of the conducting or conductive layer adjoining the electronic component to be embedded, one further particularly preferred embodiment proposes that, in the case of contacts of the electronic component that are directed toward the supporting layer, contact is made between the contacts and the structured conducting layer, or the contacts and the structured conducting layer are electrically connected, after the supporting layer has been removed.

As also already indicated above, the thickness of a conducting layer adjoining the component is usually comparatively high to achieve good heat dissipation, and for the purpose of making contact between the conducting layer and the electronic component, which generates large amounts of heat in particular during operation, having the conducting layer adjoining the same, it is proposed to make contact with substantially the entire surface of the adjoining conducting layer after the conducting layer of the electronic component has been exposed, which corresponds to a further preferred embodiment of the method according to the invention.

In this context, in order to achieve the desired heat dissipation, a preferable proposal is to form the full-surface contacting from a layer made of a conducting material, in particular a heat-conducting material.

Especially for the production of a printed circuit board intermediate product, in which contact is made with corresponding additional layers in a simple and reliable manner after the electronic component to be integrated has been exposed, it is proposed, for the purpose of finishing a printed circuit board, to form or provide additional layers and/or structuring of the printed circuit board after the conducting layer, or the contacts of the electronic component, have been exposed and after contact has been made with the adjoining conducting layer.

In accordance with the composition in the region of the electronic component to be integrated, and in particular for embedding the same and/or the elements connected thereto into the printed circuit board to be produced, one further preferred embodiment of the method according to the invention envisages that the at least one further layer of the printed circuit board is provided with a recess or depression in the region of the integrated electronic component.

So as to achieve the objects stated above, a printed circuit board, or a printed circuit board intermediate product, of the type mentioned above additionally comprises primarily an electronic component that is at least partially encased or covered by an insulating material, for example a prepreg film and/or a resin, and a conducting layer which is disposed at the height of contacts of the electronic component or of a conducting layer of a surface of the electronic component and adjoins the component, wherein the conducting layer adjoining the component has at least one clearance in accordance with the dimensions of the electronic component to be fixed, wherein the contacts of the electronic component, or the conducting layer disposed on a surface of the electronic component, is coupled or can be coupled to the conducting layer adjoining the component, wherein the conducting layer adjoining the component is formed by a metallic foil, preferably Cu foil, and wherein the component fixed to the supporting layer and at least regions of the conducting layer, which adjoins the component and is disposed on the supporting layer, are at least partially encased or covered by an insulating material, for example a prepreg film and/or a resin. This will, as mentioned above, achieve simple and reliable production of such a printed circuit board, or of a printed circuit board intermediate product, wherein preferably the layer adjoining the component and having a clearance in accordance with the dimensions of the electronic component to be fixed allows easy and reliable registration or mounting of the electronic component to be integrated, as well as a reduction or minimization of the overall height of the printed circuit board to be produced, or of the printed circuit board intermediate product to be produced, with easy electrical connection of the exposed surface of the electronic component to be integrated.

To assure simple and reliable electrical connection with the contacts of the electronic component to be integrated, it is additionally proposed that the conducting layer adjoining the component is formed by a metallic foil, preferably Cu foil.

In particular depending on the intended use of the electronic component to be integrated and/or the orientation of the contacts of the electronic component to be integrated, or of the conducting layer thereof, in relation to the supporting layer, one further preferred embodiment envisages that, especially for a conductive structure, the metallic foil, preferably Cu foil, has a thickness of no more than 15 µm, and more preferable approximately 0.1 to 10 µm. This enables providing a conducting or conductive structure having a smaller thickness, which contributes to a further reduction or minimization of the overall thickness of the printed circuit board as well, or of the printed circuit board intermediate product, to be produced.

While suitably thin foils can be used to provide a structured conductive layer for the electrical connection with the contacts of the component to be integrated, during the operation or use of electronic components, which may generate large amounts of heat, it is required or desirable to distribute the heat thus generated over larger areas or regions; thus, in this connection and especially for heat dissipation it is proposed that the metallic foil, preferably Cu foil, has a thickness of no more than 500 µm, preferably approximately 35 to 400 µm, which corresponds to a further preferred embodiment of the printed circuit board according to the invention, or the printed circuit board intermediate product according to the invention.

For reliable coupling to the contacts of the electronic component to be integrated that are directed toward the supporting layer, according to a further preferred embodiment, the conducting layer adjoining the component is formed by a structured conducting layer so as to couple to or make contact with contacts of the electronic component.

In contrast, for easy and reliable heat dissipation from an electronic component that may generate large amounts of heat during use, according to a further modified and preferred embodiment substantially full-surface contact is made with the adjoining conducting layer so as to couple to or make contact with the conducting layer of the electronic component.

So as to support reliable heat dissipation, it is further preferably proposed that the full-surface contact is formed by a layer made of a conducting material, in particular a heat-conducting material.

BRIEF DESCRIPTION OF THE DRAWINGS

The invention will be described hereinafter in detail with reference to exemplary embodiments shown schematically in the accompanying drawings. In the drawings:

FIGS. 5a and 5b are representations of a further modified embodiment of a method for producing a printed circuit board according to the invention, or a printed circuit board intermediate product according to the invention, wherein the individual layers are indicated prior to being connected to each other.

As a general note regarding the accompanying figures, it is noted that the relative thicknesses of individual layers as well as the dimensions of such layers are not true so scale, especially in comparison with the electronic component to be integrated, but in some cases have exaggerated thicknesses or dimensions for illustration purposes. Moreover, in general only a small number of contacts of an electronic component to be integrated are shown, as compared to the components that usually comprise a comparatively large number of such contacts.

DETAILED DESCRIPTION OF THE PREFERRED EMBODIMENTS

Figure 1:
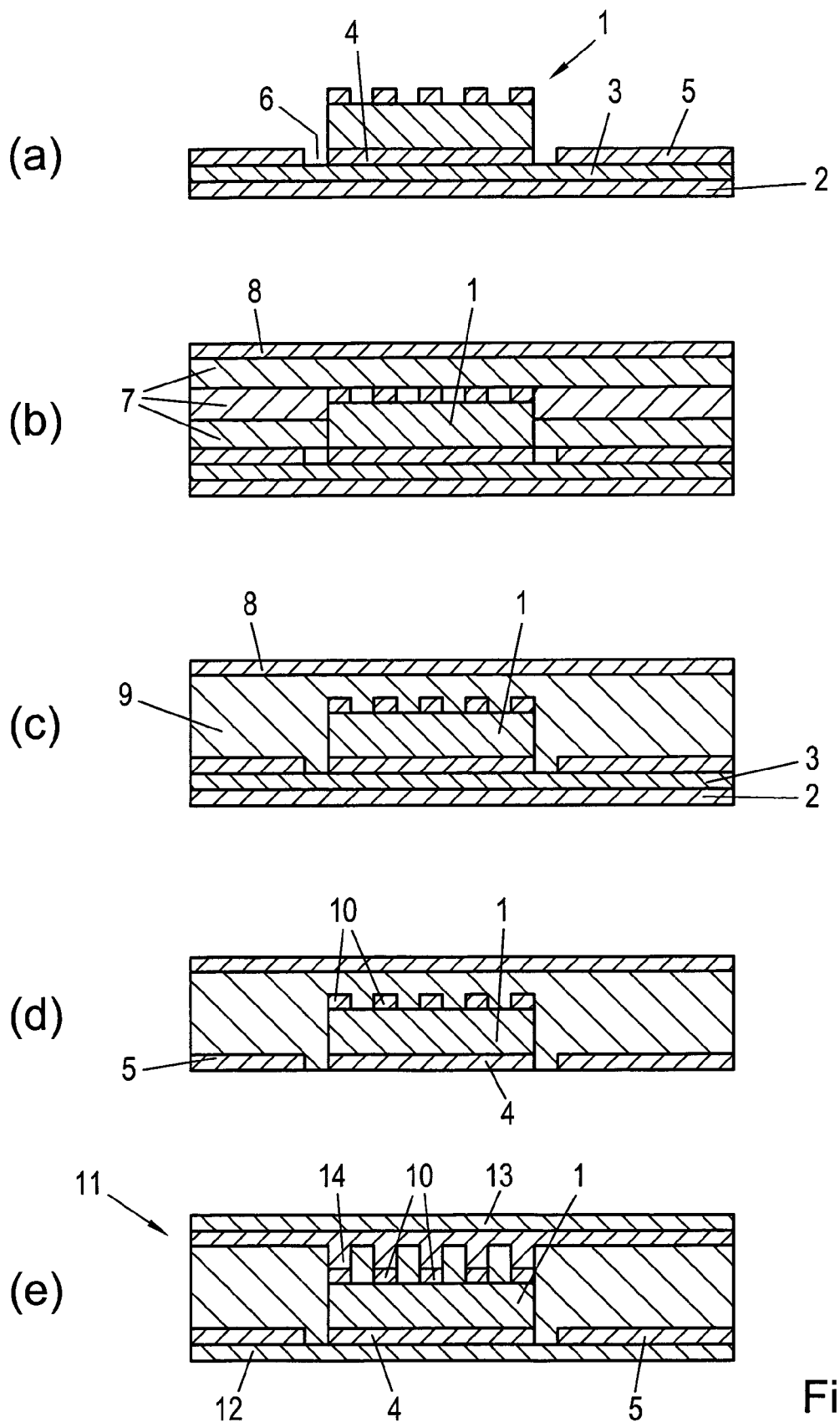
FIG. 1 shows schematic method steps of a method according to the invention for integrating at least one electronic component into a printed circuit board according to the invention, or a printed circuit board intermediate product according to the invention.

In FIG. 1 in a method step (a), a component, which is denoted in general by reference numeral 1 and which is to be integrated into a printed circuit board to be produced, or into a printed circuit board intermediate product to be produced, is mounted or fixed, wherein the electronic component 1 is supported or fixed on a supporting layer 2 and an adhesive layer 3 is provided on the supporting layer 2 for fixation.

In the embodiment shown in FIG. 1, a conducting or conductive layer 4 of the electronic component 1 is directed toward the supporting layer 2 or the adhesive layer 3. Moreover, it is apparent from method step (a) that a conducting layer, in particular a metallic foil or Cu foil 5, is also fixed on the supporting layer 2, the foil being realized with a recess or clearance in accordance with the dimension of the electronic component 1 to be mounted or integrated.

As with the layer thicknesses that are not true to scale, the lateral distance of the clearance or recess 6 of the layer 5 is also shown exaggerated in relation to the dimensions of the electronic component 1 to be received or embedded.

The fixation of both the electronic component 1 above the conducting layer 4 and of the adjoining conducting layer or metallic foil 5 is achieved, for example, by way of an adhesive, which has a corresponding small thickness of less than 15 μm, for example, and more preferable less than 5 μm. For example, such an adhesive layer can be applied using an ink jet, flexographic, intaglio or offset printing method.

After both the electronic component 1 and the conducting layer or foil 5 have been disposed on or fixed to the supporting layer 2, according to step (b) a plurality of layers 7 (indicated schematically) made of a non-conducting material, for example a plurality of prepreg films, are disposed thereon, wherein additionally a further conducting layer 8 is also indicated.

Following such an arrangement of a plurality of layers 7 and 8 surrounding the electronic component 1 or being superimposed thereon, according to step (c) the electronic component 1 to be embedded is laminated and completely encased, wherein in laminating step (c) the individual layers 7 are connected so as to obtain a common layer 9 made of insulating material.

After the electronic component 1 to be embedded has been thus encased according to step (c), in step (d) both the supporting layer 2 and the adhesive layer 3 are removed, exposing not only the conducting layer 5, but also the conducting layer 4 of the integrated electronic component 1.

It is apparent in particular here that the conducting layer 4 facing away from the contacts 10 of the electronic component is located at substantially the same height or the same plane as the conducting layer 5, so that in method step (d) a surface of the electronic component 1 to be integrated is completely exposed.

After exposing both the conducting layer 4 of the integrated electronic component 1 and the conducting layer or metallic foil 5, additional conducting layers 12 and 13 are applied so as to further create a printed circuit board or a printed circuit board intermediate product denoted schematically by reference numeral 11, wherein in method step (e) additionally contact is made with the contacts 10 of the embedded electronic component 1 by way of contact structures, for example boreholes 14 filled with conducting material, is indicated.

It is also apparent from the representation according to FIG. 1 that, for example for good heat dissipation or heat removal, the conducting layer 4 of the integrated electronic component 1 is connected substantially across the entire surface to the additional conducting layer 12 and, for distribution of the heat over larger regions, also has a full-surface connection to the adjoining regions of the conducting layer or metallic foil 5 that are located at the same height.

Figure 2:
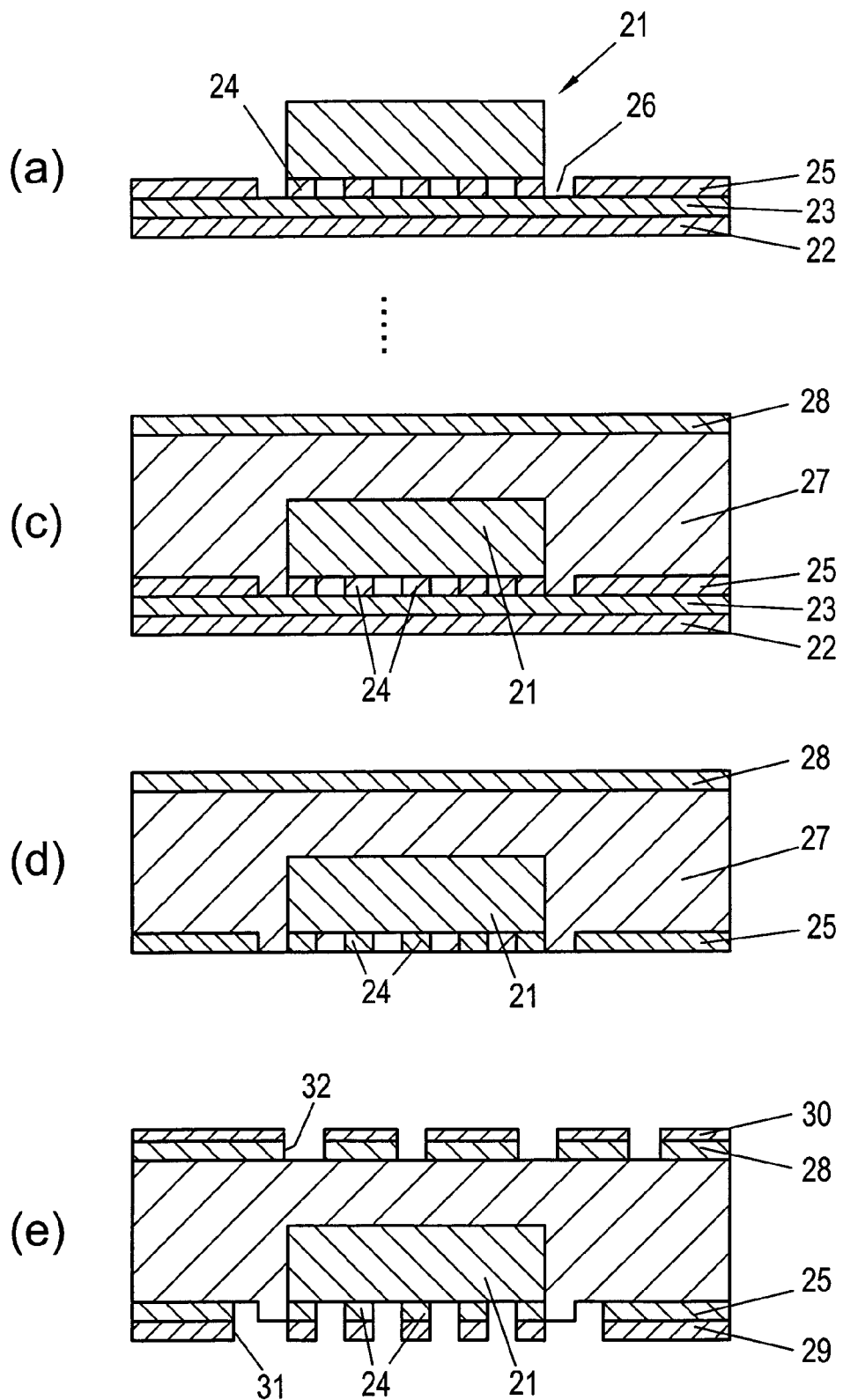
FIG. 2, in a representation that is similar to FIG. 1, shows individual method steps of a modified method according to the invention for integrating an electronic component into a printed circuit board according to the invention, or a printed circuit board intermediate product according to the invention, wherein contrary to the representation of FIG. 1, in which a conducting layer of the electronic component to be integrated is directed toward a supporting layer, the electronic component to be integrated is provided with contacts that are directed toward the supporting layer in the embodiment according to FIG. 2.

FIG. 2 shows a modified embodiment of a method for embedding an electronic component, wherein in a first method step again denoted by (a), an electronic component 21 to be embedded is fixed to a supporting layer 22 by way of an interposed adhesive layer 23.

Contrary to the embodiment according to FIG. 1, the electronic component 21 to be integrated is fixed to the supporting layer 22 or the adhesive layer 23 by way of contacts 24 directed toward the supporting layer 22.

Similarly to the embodiment according to FIG. 1, a conducting layer or metallic foil 25 is again provided on the supporting layer 22 or the adhesive layer 23, the layer or foil comprising a clearance or recess 26 in accordance with the outside dimensions of the electronic component 21 to be integrated.

In FIG. 2 a method step is denoted by (c) in a like manner as step (c) of FIG. 1; according to which, after applying a plurality of layers made of insulating material (not shown), for example by way of a lamination process, the integrated electronic component 21 is completely embedded in a casing 27 made of insulating material, wherein a conducting layer 28 is indicated, as with the embodiment of FIG. 1.

After the electronic component 21 has been thus embedded in accordance with step (c) of FIG. 2, again both the contacts 24 of the integrated electronic component 21 and the adjoining conducting layer or metallic foil 25 are exposed, in a way similar to the preceding embodiment according to step (d). Again, the contacts 24 as well as the conducting, and in particular structured, layer 25 are located at substantially the same height or same level, so that, similarly to the preceding embodiment, again exposure of a surface of the integrated electronic component, which in this case comprises the contacts 24, and of the conducting layer or metallic foil 25 is made possible.

In a step again denoted by (e), additional conducting layers 29 and 30 are applied and structured, as is indicated by apertures and boreholes 31 and 32 as well as by the contact with the contacts 24 of the integrated electronic component 21.

Figure 3:
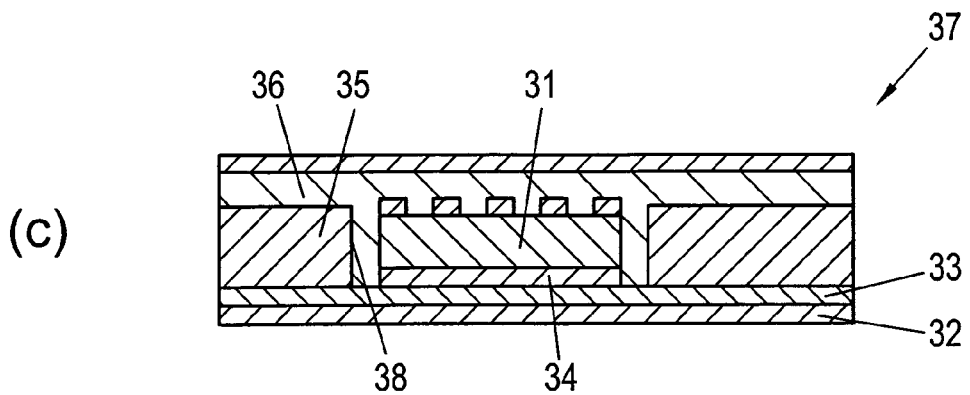
FIG. 3 is a representation of a further modified embodiment of a printed circuit board according to the invention, or a printed circuit board intermediate product according to the invention, wherein a conducting layer having a comparatively large thickness is provided next to the electronic component to be integrated on the supporting layer, especially for heat dissipation.

FIG. 3 shows a modified embodiment similar to method step (c) of FIG. 1, wherein it is apparent that, contrary to the layer or foil 5 having a comparatively small thickness in the embodiment according to FIG. 1, a conducting layer or metallic foil 35, which has a clearance 38 and adjoins to or abuts the integrated electronic component denoted by reference numeral 31, has a comparatively large thickness, which in the embodiment shown essentially amounts to the entire height of the integrated electronic component 31, the height of which is several 100 μm, for example.

After the electronic component 31 has been encased, as shown in FIG. 3, by a layer made of insulating material denoted by reference numeral 36, both the conducting layer 34 of the integrated electronic component 31 and the adjoining layer 35 having a large thickness are again exposed, similarly to the embodiment according to FIG. 1, wherein good distribution of heat across large regions of the printed circuit board, or of the printed circuit board intermediate product 37, can take place by applying an additional conducting layer, as is indicated in FIG. 1.

Figure 4:
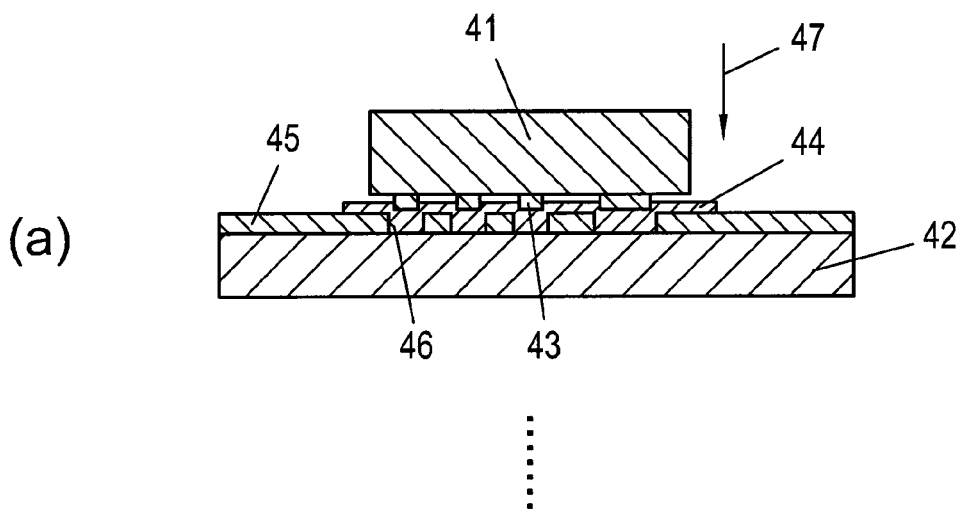
FIG. 4 shows only two method steps of a method that is similar to that shown in FIG. 2, wherein again contacts of an electronic component to be integrated are directed toward the supporting layer.
Figure 4:
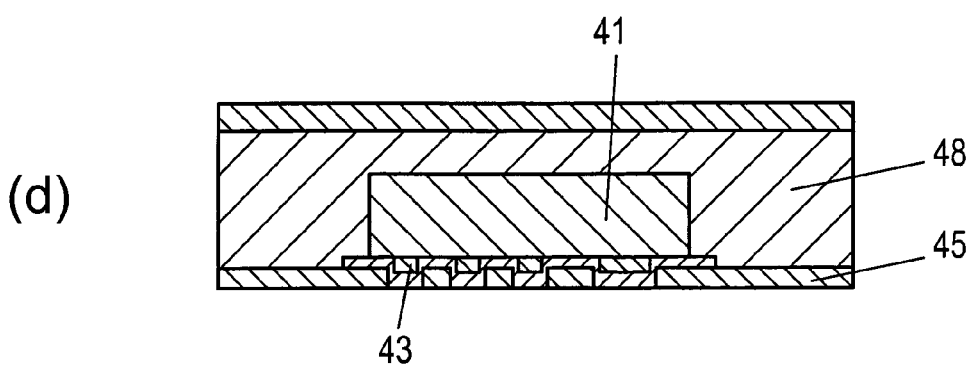

Similarly to the embodiment according to FIG. 2, in the illustration according to FIG. 4 an electronic component 41 to be integrated having contacts 43 that are directed toward a supporting layer 42 is mounted or fixed, wherein an adhesive layer 44 is indicated for the purpose of fixation.

A conducting layer or metallic foil 45 additionally applied to the supporting layer 42 is provided with a plurality of recesses or clearances 46 in accordance with the contacts 43 of the electronic component 41 to be integrated, so that the contacts 42 enter the recesses or clearances 46 of the conducting layer 45 during mounting or fixation of the electronic component 41, as is indicated by the arrow 47.

Moreover, it is apparent from FIG. 4, omitting several intermediate steps from the preceding FIGS. 1 and 2, that both the contacts 43 of the component 41 and the adjoining conducting layer or metallic foil 45 are exposed after the electronic component 41 to be integrated has been embedded into a layer 48 made of insulating material and removing the supporting layer 42. As a result, similarly to the embodiment according to FIG. 2, easy and reliable contact can be made with the contacts 43 of the integrated electronic component 41 by subsequently applying or disposing additional conducting layers and structuring the same. The conducting layer or metallic foil 45 adjoining the electronic component 41 is again located at the same height as the contacts 43 of the integrated electronic component 41, which are exposed after removal of the supporting layer 42.

In the embodiment shown in FIGS. 5a and 5b, an electronic component 51 to be integrated is again supported on a supporting layer 52, wherein contacts of the component 51 are not shown in detail. Similarly to the preceding embodiments, the electronic component 51 can again be fixed to the layer 52 using an adhesive.

A conducting layer or metallic foil 53 is again provided with a clearance or recess 60 in accordance with the dimensions of the electronic component 51 to be integrated, wherein, similarly to the preceding embodiments, additionally a layer 54 made of insulating material is disposed over the conducting layer 53, the layer 54 also having a clearance that is adapted to the dimensions of the component 51. Additional layers of the printed circuit board, or of the printed circuit board intermediate product, to be produced are denoted by reference numerals 55 and 56, wherein the layer 55, similarly to layer 54, is made of a non-conducting metal, for example a prepreg, while the layer 56 is made of a conducting material or a conducting foil.

FIG. 5b shows that, for the purpose of integrating the component 51 to be integrated, an additional layer 57, which as in the preceding embodiments is to be provided after electrical connection of the contacts (not shown in detail), has a recess 59 in accordance with a provided structure or structuring, which is formed, for example, by the support layer 52 or a layer replacing this supporting layer 52 and a schematically indicated further layer 58, so as to be able to completely integrate the structure that is provided in the region of the component 51 into the printed circuit board 61 to be produced, or the printed circuit board intermediate product to be produced.

Instead of an adhesive or the adhesive layers as shown in the figures, it is also possible, for the purpose of fixing the electronic components 1, 21, 31, 41, 51 to be integrated, to use a water-soluble film or a water-soluble foil, for example, which is provided on the surface of the component to be integrated that is directed toward the supporting layer, so as to temporarily fix the component.

The invention claimed is:

1. A method for integrating at least one electronic component into a printed circuit board or a printed circuit board intermediate product, comprising the following steps:
   providing a layer to at least temporarily support the electronic component;
   fixing the electronic component on the layer, wherein contacts of the electronic component are, or a conducting layer disposed on a surface of the electronic component is, oriented toward the supporting layer;
   disposing a conducting layer (5, 25, 35, 45, 53), which has at least one clearance (6, 26, 38, 46, 60) in accordance with the dimensions of the electronic component (1, 21, 31, 41, 51) to be fixed, on the supporting layer at the height of contacts of the electronic component or of a conducting layer of a surface of the electronic component wherein the conducting layer adjoining the component is formed by a metallic foil, preferably Cu foil;
   at least partially encasing or covering the component fixed on the supporting layer and at least regions of the conducting layer, which adjoins the component and is disposed on the supporting layer, with insulating material, for example a prepreg film and/or a resin;
   exposing the contacts or the conducting layer of the electronic component and at least regions of the conducting layer, which adjoins the component and is disposed on the supporting layer, after or by removal of the supporting layer; and
   making at least partial contact between the contacts or the conducting layer of the electronic component and the conducting layer adjoining the component.

2. The method according to claim 1, characterized in that the electronic component is fixed on the supporting layer by way of an interposed adhesive layer, an adhesive film, an adhesive coating of the component or the like, wherein the adhesive layer is removed together with the supporting layer.

3. The method according to claim 2, characterized in that the adhesive layer or adhesive film or coating (K) is realized having a thickness of no more than 15 µm, preferably approximately 0.1 to 10 µm.

4. The method according to claim 3, characterized in that the adhesive layer is applied by way of ink jet, flexographic, intaglio or offset printing.

5. The method according to claim 4, characterized in that especially for a conductive structure, the metallic foil, preferably Cu foil, is realized having a thickness of no more than 15 µm, and preferably approximately 0.1 to 10 µm.

6. The method according to claim 5, characterized in that the conducting layer adjoining the component is formed by a structured layer, wherein preferably the conducting layer is structured after lamination.

7. The method according to claim 5, characterized in that after exposing the conducting layer of the electronic component substantially full-surface contact is made with the adjoining conducting layer.

8. The method according to claim 7, characterized in that the full-surface contact is formed by a layer made of a conducting material, in particular heat-conducting material.

9. The method according to claim 8, characterized in that the at least one further layer of the printed circuit board is provided with a recess or depression in the region of the integrated electronic component.

10. The method according to claim 7, characterized in that, after exposing the conducting layer or the contacts of the electronic component and making contact with the adjoining conducting layer, further layers and/or structuring of the printed circuit board are formed or provided.

11. The method according to claim 4, characterized in that, especially for heat dissipation, the metallic foil, preferably Cu foil, is realized having a thickness of no more than 500 μm, preferably approximately 35 to 400 μm.

12. A method according to claim 11, characterized in that, in the case of contacts of the electronic components that are directed toward the supporting layer, after removing the supporting layer, contact is made between the contacts and the structured conducting layer, or the contacts are connected to the structured conducting layer.

13. A printed circuit board or a printed circuit board intermediate product, comprising an electronic component, which is at least partially encased by an insulating material, for example a prepreg film and/or a resin, or covered thereby, and a conducting layer, which is disposed at the height of contacts of the electronic component or of a conducting layer of a surface of the electronic component and adjoins the component, wherein the conducting layer adjoining the component has at least one clearance in accordance with the dimensions of the electronic component to be fixed, wherein the contacts of the electronic component are, or the conducting layer disposed on a surface of the electronic component is, coupled or able to be coupled to the conducting layer adjoining the component, wherein the conducting layer adjoining the component is formed by a metallic foil, preferably Cu foil, and wherein the component fixed on the supporting layer and at least regions of the conducting layer, which adjoins the component and is disposed on the supporting layer, are at least partially encased or covered with an insulating material, for example a prepreg film and/or a resin.

14. The printed circuit board or printed circuit board intermediate product according to claim 13, characterized in that especially for a conductive structure, the metallic foil, preferably Cu foil, has a thickness of no more than 15 μm, preferably approximately 0.1 to 10 μm.

15. The printed circuit board or printed circuit board intermediate product according to claim 13, characterized in that especially for heat dissipation, the metallic foil, preferably Cu foil, has a thickness of no more than 500 μm, preferably approximately 35 to 400 μm.

16. The printed circuit board or printed circuit board intermediate product according to claim 13, characterized in that the conducting layer adjoining the component is formed by a structured conducting layer so as to couple to or make contact with contacts of the electronic component.

17. The printed circuit board or printed circuit board intermediate product according to claim 13, characterized in that substantially full-surface contact with the adjoining conducting layer is provided for so as to couple to or make contact with the conducting layer of the electronic component.

18. The printed circuit board or printed circuit board intermediate product according to claim 17, characterized in that the full-surface contact is formed by a layer made of a conducting material, in particular heat-conducting material.

* * * * *